United States Patent
Kim

(10) Patent No.: US 10,651,163 B2
(45) Date of Patent: May 12, 2020

(54) SEMICONDUCTOR DEVICE AND SEMICONDUCTOR SYSTEM

(71) Applicant: SK hynix Inc., Icheon-si Gyeonggi-do (KR)

(72) Inventor: Jung Hyun Kim, Seongnam-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/115,243

(22) Filed: Aug. 28, 2018

(65) Prior Publication Data

US 2018/0366458 A1 Dec. 20, 2018

Related U.S. Application Data

(62) Division of application No. 14/966,088, filed on Dec. 11, 2015, now Pat. No. 10,090,288.

(30) Foreign Application Priority Data

Sep. 4, 2015 (KR) .................. 10-2015-0125805

(51) Int. Cl.
- *G01R 31/317* (2006.01)
- *H01L 27/02* (2006.01)
- *H01L 27/11582* (2017.01)
- *H01L 49/02* (2006.01)

(52) U.S. Cl.
CPC .... *H01L 27/0207* (2013.01); *G01R 31/31708* (2013.01); *G01R 31/31715* (2013.01); *H01L 27/11582* (2013.01); *H01L 28/00* (2013.01)

(58) Field of Classification Search
CPC ........ G01R 31/31708; G01R 31/31715; G01R 31/2832; G01R 31/2607; G01R 31/26; G01R 31/28
See application file for complete search history.

(56) References Cited

U.S. PATENT DOCUMENTS

| | | | |
|---|---|---|---|
| 2004/0124859 A1* | 7/2004 | Muller | G01R 31/31715 324/713 |
| 2007/0090848 A1 | 4/2007 | Tumin et al. | |
| 2015/0185285 A1 | 7/2015 | Kovalev et al. | |
| 2015/0333753 A1* | 11/2015 | Chen | H03K 19/0027 326/30 |

FOREIGN PATENT DOCUMENTS

| | | |
|---|---|---|
| KR | 1020080046919 A | 5/2008 |
| KR | 100853480 B1 | 8/2008 |

* cited by examiner

*Primary Examiner* — Tung X Nguyen
(74) *Attorney, Agent, or Firm* — William Park & Associates Ltd.

(57) ABSTRACT

A semiconductor system includes a first semiconductor device suitable for outputting an external command and a termination control signal and being inputted with a data signal; and a second semiconductor device suitable for generating a termination enable signal in response to the external command and the termination control signal, generating a pull-up signal in response to the termination enable signal, and generating a pull-down signal in response to the termination enable signal and a test mode signal.

6 Claims, 7 Drawing Sheets

SEMICONDUCTOR DEVICE AND SEMICONDUCTOR SYSTEM

CROSS-REFERENCE TO RELATED APPLICATION

The present application is a divisional application for U.S. patent application Ser. No. 14/966,088 now U.S. Pat. No. 10,090,288 and claims priority under 35 U.S.C. § 119(a) to Korean application number 10-2015-0125805 filed on Sep. 4, 2015, in the Korean Intellectual Property Office, which is incorporated herein by reference in its entirety.

BACKGROUND

1. Technical Field

Embodiments of the present disclosure generally relate to an integrated circuit and an electronic device, and more particularly to a semiconductor device and a semiconductor system capable of testing a termination operation.

2. Related Art

As an operation speed of a semiconductor device increases, a signal swing gradually decreases to minimize a propagation delay that may occur during the signal transmission. Such small-amplitude signals are highly susceptible to interference and noise. In addition, an impedance mismatch condition may reduce the power transfer of the signal and also cause signal reflection at interfaces between different transmission lines. As a result, it is difficult for semiconductor device using small-amplitude signals to carry out high-speed data transmission without any distortion to the signals. Also, the impedance mismatch condition causes a signal transmission error.

In order for the transmission lines to minimize distortion of the signal and the signal transmission error, the impedance of the different transmission lines must be uniform. When the transmission lines are in the impedance mismatch condition, a termination impedance may be placed at interfaces between different transmission lines to achieve impedance matching. For instance, the semiconductor device performs a termination operation by coupling a termination resistor having the same impedance as a characteristic impedance of a transmission line to a reception terminal or a transmission terminal of a signal. Here, the impedance of the termination resistor matches the impedance of the reception terminal or the transmission terminal and the characteristic impedance of the transmission line. Instead of having termination resistor located outside a semiconductor chip, On-Die Termination (ODT) allows the termination resistor to be located inside the semiconductor chips.

SUMMARY

Various embodiments are directed to a semiconductor device and a semiconductor system, capable of testing whether a termination operation is normally performed.

In an embodiment, a semiconductor system may include: a first semiconductor device suitable for outputting an external command and a termination control signal, and being inputted with a data signal; and a second semiconductor device suitable for generating a termination enable signal in response to the external command the termination control signal, generating a pull-up signal in response to the termination enable signal, and generating a pull-down signal in response to the termination enable signal and a test mode signal.

In an embodiment, a semiconductor device may include: a pull-up signal generation unit suitable for generating a pull-up signal in response to a termination enable signal and a pre-pull-up signal; and a pull-down signal generation unit suitable for generating a pull-down signal in response to a test mode signal, the termination enable signal and a pre-pull-down signal.

According to the embodiments, through controlling a voltage level of a data pad according to whether a termination operation is performed in a test mode, it is possible to determine whether the termination operation is normally performed, by sensing the voltage level of the data pad.

FIG, 6 is a timing diagram provided to assist in explaining an operation of the semiconductor system shown in FIGS. 1 to 5.

Figure 5:
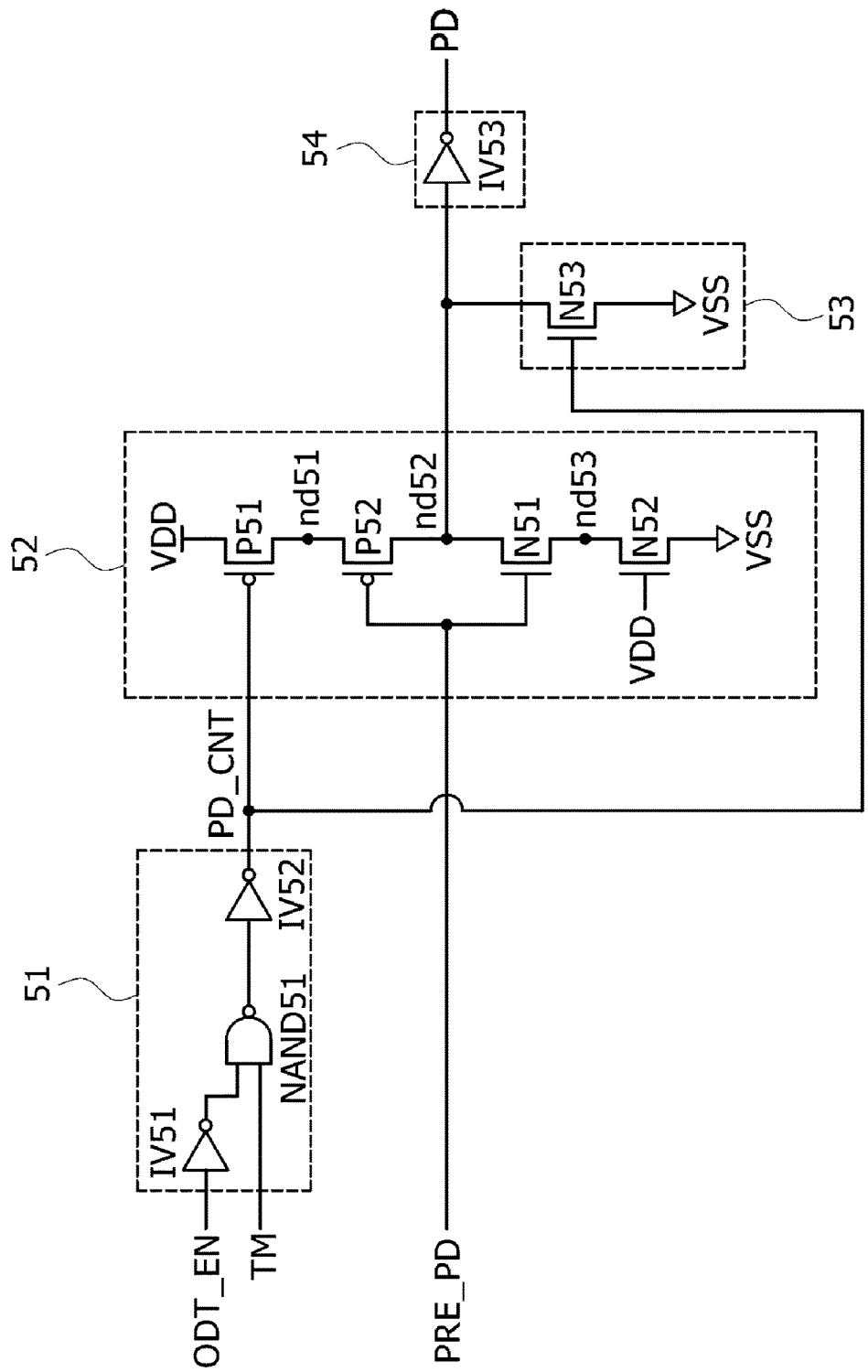
FIG. 5 is a circuit diagram illustrating a pull-down signal generation unit included in the output driver shown in FIG. 2.
Figure 6:
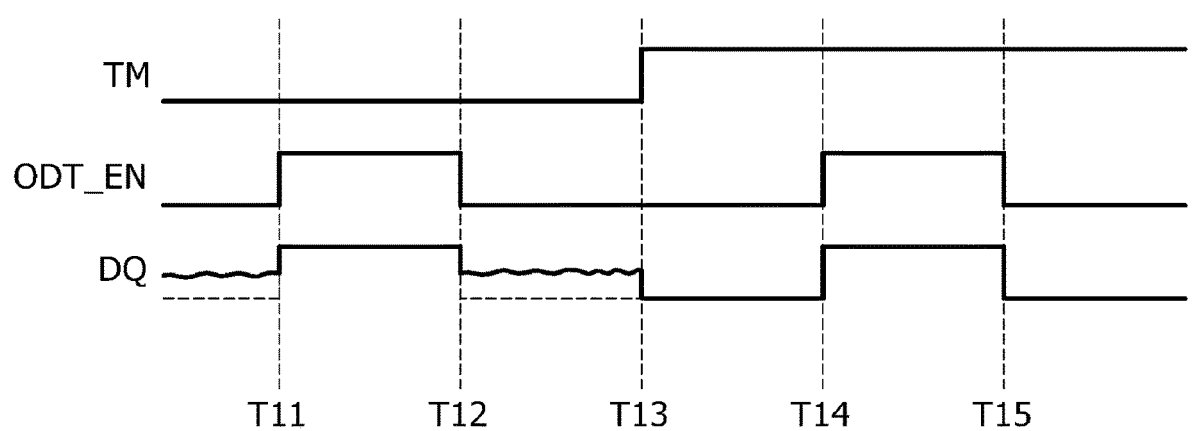
Figure 7:
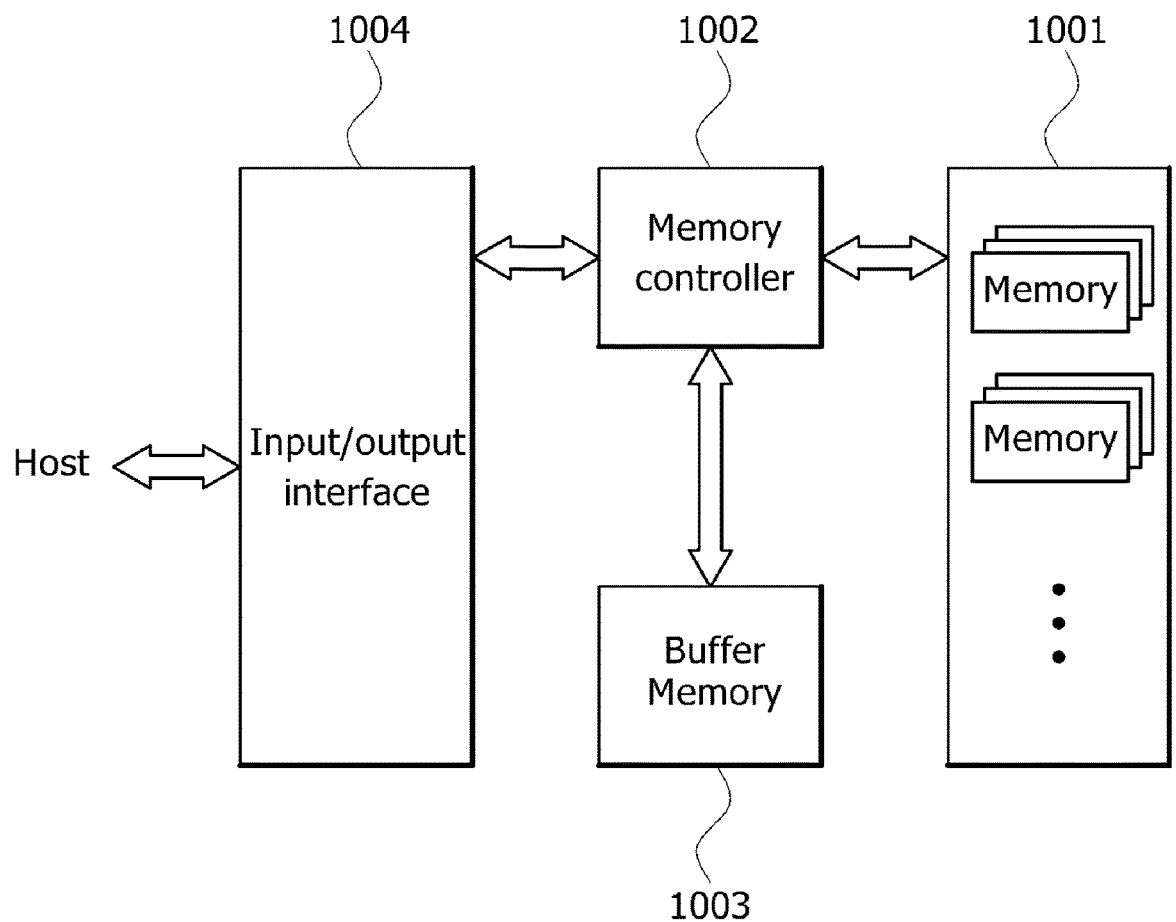

FIG. 7 is a diagram illustrating an electronic system to which the semiconductor devices and the semiconductor system shown in FIGS. 1 to 6 are applied.

DETAILED DESCRIPTION

Hereinafter, a semiconductor device and a semiconductor system will be described below with reference to the accompanying drawings through various examples of embodiments.

Figure 1:
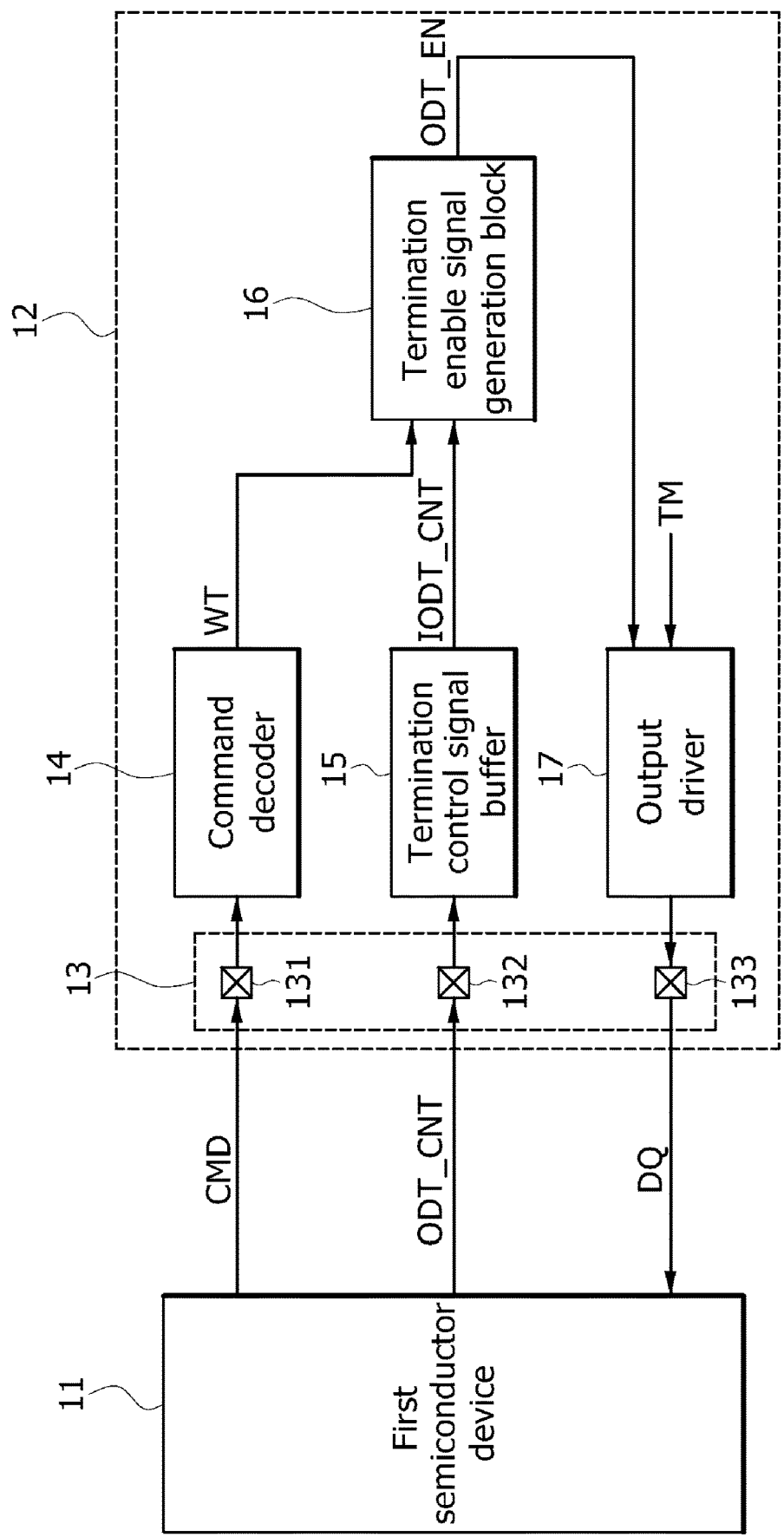
FIG. 1 is a block diagram illustrating a semiconductor system in accordance with an embodiment.

As shown in FIG. 1, a semiconductor system in accordance with an embodiment may include a first semiconductor device 11 and a second semiconductor device 12.

The first semiconductor device 11 may output an external command CMD and a termination control signal ODT_CNT. The first semiconductor device 11 may be inputted with a data signal DQ. The external command CMD may include a plurality of bits, and be set to various combinations of logic levels. The external command CMD may be transmitted through lines that is used for transmitting only a command or lines that is used for transmitting both the command and an address. The termination control signal ODT_CNT may be inputted to control a termination operation of the second semiconductor device 12. During the termination operation of the second semiconductor device 12, a termination resistor is coupled to a pad through which signals are inputted and outputted.

The second semiconductor device 12 may include a pad block 13, a command decoder 14, a termination control signal buffer 15, a termination enable signal generation block 16, and an output driver 17. The pad block 13 may include a first pad 131, a second pad 132, and a third pad 133. The first pad 131 may be inputted with the external command CMD from the first semiconductor device 11. The second pad 132 may be inputted with the termination control signal ODT_CNT from the first semiconductor device 11. The third pad 133 may output the data signal DQ to the first semiconductor device 11.

The command decoder 14 may be inputted with the external command CMD, and generate a write command WT. The command decoder 14 may be inputted with the external command CMD through the first pad 131. The write command WT may be enabled in the case where the external command CMD has a preset logic level combination. A logic level at which the write command WT is enabled may be set in a variety of ways according to embodiments. The second semiconductor device 12 may perform a write operation in response to an enabled write command WT. During the write operation, the second semiconductor device 12 may be inputted with a data signal DQ through the third pad 133. In the case where the write command WT is enabled and the write operation is performed, the second semiconductor device 12 may perform the termination operation for the third pad 133.

The termination control signal buffer 15 may generate an internal termination control signal IODT_CNT in response to the termination control signal ODT_CNT. The termination control signal buffer 15 may be inputted with the termination control signal ODT_CNT through the second pad 132. The termination control signal buffer 15 may generate an enabled internal termination control signal IODT_CNT in response to an enabled termination control signal ODT_CNT. The termination control signal ODT_CNT may be a control signal that carries out the termination operation of the second semiconductor device 12. A logic level at which the internal termination control signal IODT_CNT is enabled may be set in a variety of ways according to embodiments.

The termination enable signal generation unit 16 may generate a termination enable signal ODT_EN in response to the write command WT and the internal termination control signal IODT_CNT. The termination enable signal generation unit 16 may generate an enabled termination enable signal ODT_EN in response to the write command WT and the enabled internal termination control signal IODT_CNT is enabled, The termination enable signal ODT_EN may be enabled to perform the termination operation of the second semiconductor device 12. A logic level at which the termination enable signal ODT_EN is enabled may be set in a variety of ways according to embodiments. When the termination operation is performed in response to the enabled termination enable signal ODT_EN, a termination resistor is coupled to the third pad 133.

The output driver 17 may drive the data signal DQ in response to the termination enable signal ODT_EN and a test mode signal TM. The output driver 17 may output the data signal DQ to the first semiconductor device 11 through the third pad 133. The test mode signal TM may be enabled in a test mode for testing the termination operation. The test mode signal TM may be inputted from the first semiconductor device 11 or a separate test equipment (not shown). The test mode signal TM may be generated inside the second semiconductor device 12 according to an embodiment. The output driver 17 may drive the third pad 133 with a power supply voltage VDD in response to the enabled termination enable signal ODT_EN is enabled when it is not in the test mode, and may allow the third pad 133 to float in response to the disabled termination enable signal ODT_EN when it is not in the test mode. The output driver 17 may drive the data signal DQ with the power supply voltage VDD, in the case where the termination enable signal ODT_EN is enabled in a state in which the test mode is entered, and may pull the data signal DQ to a ground voltage VSS, in the case where the termination enable signal ODT_EN is disabled in a state in which the test mode is entered. The output driver 17 may output internal data, which has been outputted from a memory cell array (not shown) in a read operation, as a data signal DQ through the third pad 133.

Figure 2:
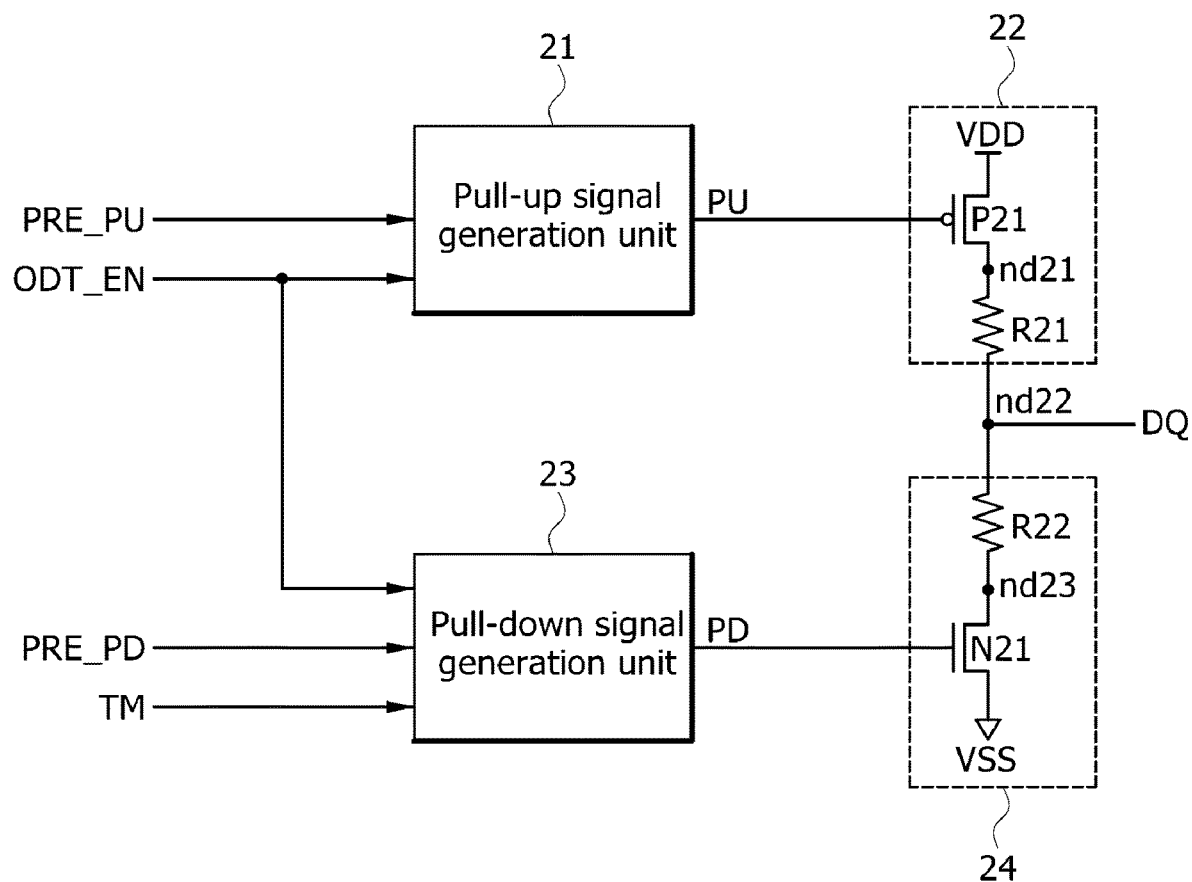
FIG. 2 is a diagram illustrating an output driver included in the semiconductor system shown in FIG. 1.

Referring to FIG. 2, the output driver 17 may include a pull-up signal generation unit 21, a pull-up driver 22, a pull-down signal generation unit 23, and a pull-down driver 24.

The pull-up signal generation unit 21 may generate a pull-up signal PU in response to the termination enable signal ODT_EN and a pre-pull-up signal PRE_PU. The pull-up signal generation unit 21 may generate an enabled pull-up signal PU, which is at a logic low level, in response to the enabled termination enable signal ODT_EN, which is at a logic high level. The pull-up signal generation unit 21 may generate a disabled pull-up signal PU, which is at a logic high level, in response to the disabled termination enable signal ODT_EN, which is at a logic low level. In other words, in the case where the termination operation is performed, the pull-up signal generation unit 21 may generate the enabled pull-up signal PU, which is at the logic low level. In the read operation, the pull-up signal generation unit 21 may generate the pull-up signal PU according to a level of the pre-pull-up signal PRE_PU. The read operation may be performed in a state in which the termination enable signal ODT_EN is disabled. The pre-pull-up signal PRE_PU may be set in its level according to internal data outputted from the memory cell array in the read operation. For example, in the case where the internal data is at a logic high level, the pull-up signal generation unit 21 may be inputted with the pre-pull-up signal PRE_PU that is at a logic high level, and generate the enabled pull-up signal PU, which is at the logic low level. In the case where the internal data is at a logic low level, the pull-up signal generation unit 21 may be inputted with the pre-pull-up signal PRE_PU that is at a logic low level, and generate the disabled pull-up signal PU, which is at the logic high level.

The pull-up driver 22 may include a PMOS transistor P21 and a resistor element R21. The PMOS transistor P21 coupled between the power supply voltage VDD and a node nd21 may be turned on in response to the pull-up signal PU. The resistor element R21 may be coupled between the node nd21 and a node nd22. The node nd22 may be coupled to the third pad 133 through which the data signal DQ is outputted. In the case where the pull-up driver 22 is inputted with the enabled pull-up signal PU, which is at the logic low level, the pull-up driver 22 may drive the node nd22 with the power supply voltage VDD as the PMOS transistor P21 is turned on. In the case where the pull-up driver 22 is inputted with the pull-up signal PU, which is enabled as the termination operation is performed, the resistor element R21 may be used as a termination resistor.

The pull-down signal generation unit 23 may generate a pull-down signal PD in response to the termination enable signal ODT_EN, the test mode signal TM and a pre-pull-down signal PRE_PD. In the case where the test mode is not entered and thus the test mode signal TM is disabled to a logic low level, the pull-down signal generation unit 23 may generate the disabled pull-down signal PD, which is at a logic low level, regardless of the termination enable signal ODT_EN. In the case where the termination enable signal ODT_EN is enabled in a state in which the test mode is entered and thus the test mode signal TM is enabled, the pull-down signal generation unit 23 may generate the enabled pull-down signal PD, which is at the logic low level. In the case where the termination enable signal ODT_EN is disabled in a state in which the test mode is entered and thus the test mode signal TM is enabled, the pull-down signal generation unit 23 may generate the enabled pull-down signal PD, which is at a logic high level. In the case where the termination operation is not performed in the test mode, the pull-down signal generation unit 23 may generate the enabled pull-down signal PD, which is at the logic high level. In the read operation, the pull-down signal generation unit 23 may generate the pull-down signal PD according to a level of the pre-pull-down signal PRE_PD. The read operation may be performed in a state in which the termination enable signal ODT_EN is disabled. The pre-pull-down signal PRE_PD may be set in its level according to internal data outputted from the memory cell array in the read operation. For example, in the case where the internal data is at the logic high level, the pull-down signal generation unit 23 may be inputted with the pre-pull-down signal PRE_PD that is at a logic high level, and generate the disabled pull-down signal PD, which is at the logic low level. In the case where the internal data is at the logic low level, the pull-down signal generation unit 23 may be inputted with the pre-pull-down signal PRE_PD that is at low level, and generate the enabled pull-down signal PD, which is at the logic high level.

The pull-down driver 24 may include an NMOS transistor N21 and a resistor element R22. The NMOS transistor N21 may be coupled between the ground voltage VSS and a node nd23, and be turned on in response to the pull-down signal PD. The resistor element R22 may be coupled between the node nd22 and the node nd23. The node nd22 may be coupled to the third pad 133 through which the data signal DQ is outputted. In the case where the pull-down driver 24 is inputted with the enabled pull-down signal PD, which is at the logic high level, the pull-down driver 24 may drive the node nd22 with the ground voltage VSS as the NMOS transistor N21 is turned on.

Figure 3:
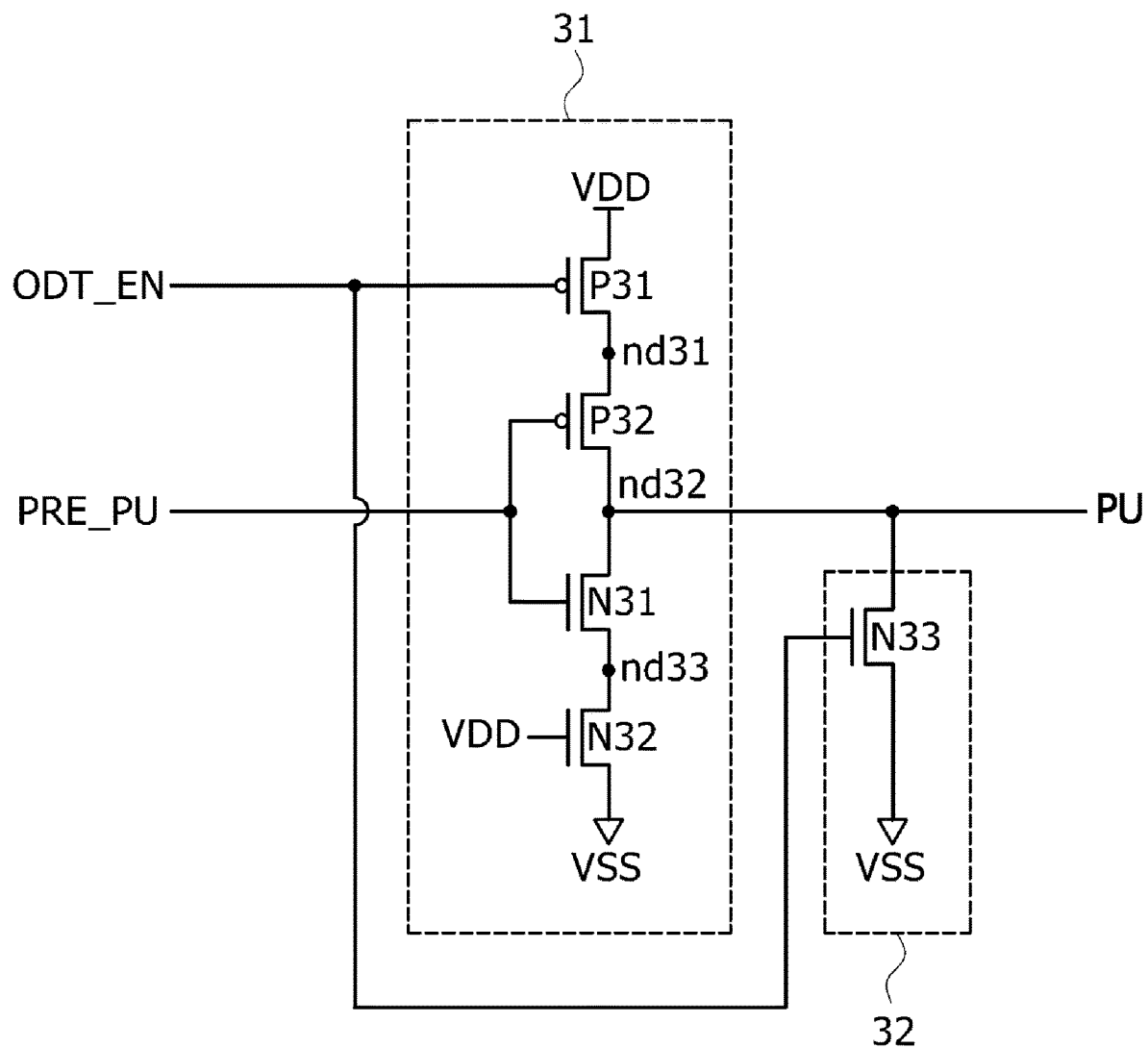
FIG. 3 is a circuit diagram illustrating a pull-up signal generation unit included in the output driver shown in FIG. 2.

Referring to FIG. 3, the pull-up signal generation unit 21 may include a pull-up pre-driver 31 and a pull-up control section 32. The pull-up pre-driver 31 may include PMOS transistors P31 and P32 and NMOS transistors N31 and N32. The PMOS transistor P31 coupled between the power supply voltage VDD and a node nd31 may be turned on in response to the termination enable signal ODT_EN. The PMOS transistor P32 coupled between the node nd31 and a node nd32 may be turned on in response to the pre-pull-up signal PRE_PU. The NMOS transistor N31 coupled between the node nd32 and a node nd33 may be turned on in response to the pre-pull-up signal PRE_PU. The NMOS transistor N32 coupled between the node nd33 and the ground voltage VSS may be turned on in response to the power supply voltage VDD. In the case where the PMOS transistor P31 is turned on in response to the disabled termination enable signal ODT_EN, which is at the logic low level, the pull-up pre-driver 31 may drive the node nd32 according to a logic level of the pre-pull-up signal PRE_PU which is inputted in the read operation. In the case where the pre-pull-up signal PRE_PU of the logic high level is inputted in the read operation, the pull-up pre-driver 31 may drive the node nd32 with the ground voltage VSS, and generate the enabled pull-up signal PU, which is at the logic low level. In the case where the pre-pull-up signal PRE_PU of the logic low level is inputted in the read operation, the pull-up pre-driver 31 may drive the node nd32 with the power supply voltage VDD, and generate the disabled pull-up signal PU, which is at the logic high level.

The pull-up control section 32 may include an NMOS transistor N33. The NMOS transistor N33 coupled between the node nd32 and the ground voltage VSS may be turned on in response to the termination enable signal ODT_EN. In the case where the NMOS transistor N33 is turned on in response to the enabled termination enable signal ODT_EN, which is at the logic high level, the pull-up control section 32 may drive the node nd32 with the ground voltage VSS, and generate the enabled pull-up signal PU, which is at the logic low level.

Figure 4:
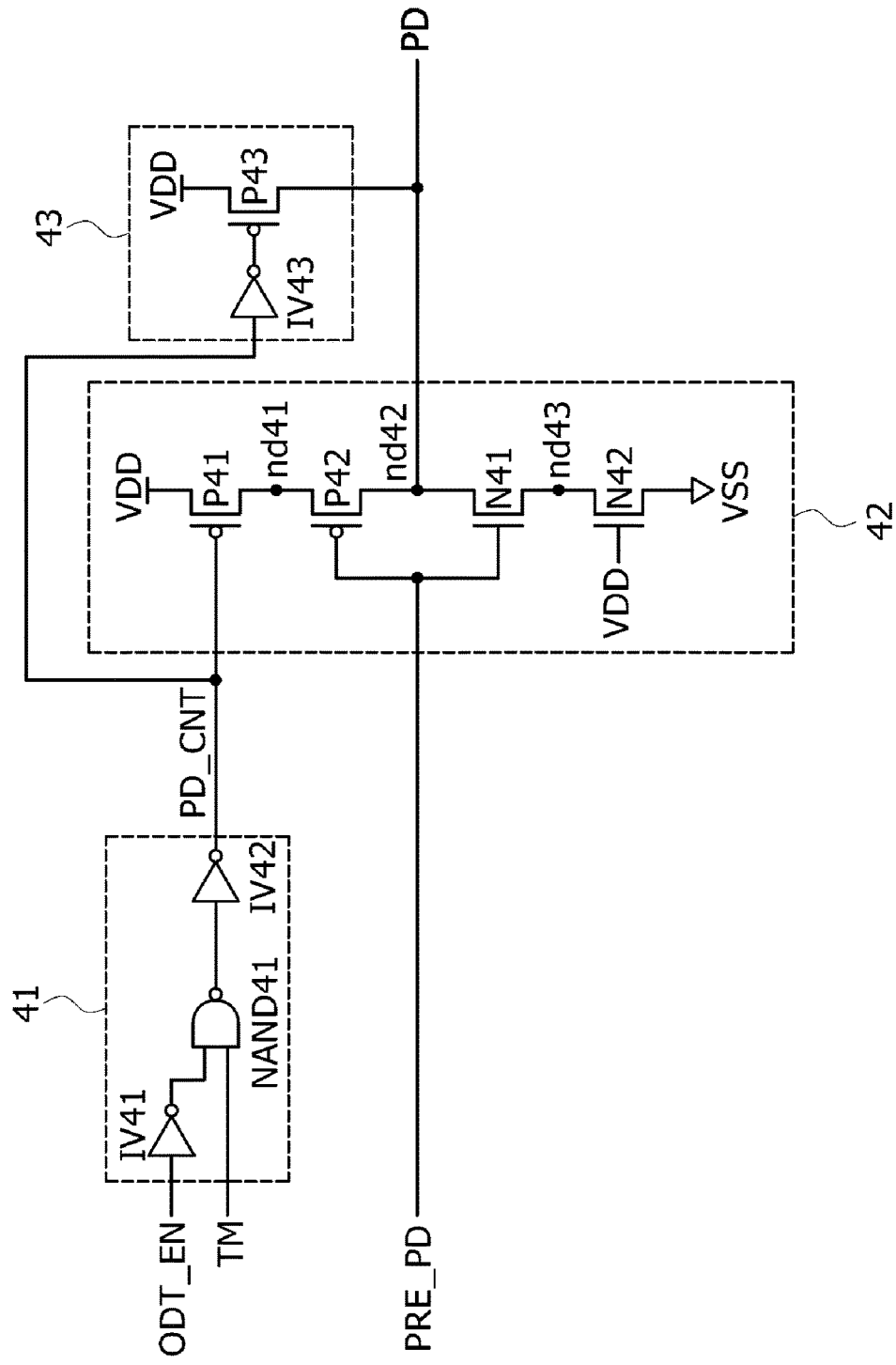
FIG. 4 is a circuit diagram illustrating a pull-down signal generation unit included in the output driver shown in FIG. 2.

Referring to FIG. 4, the pull-down signal generation unit 23 may include a pull-down control signal generation section 41, a pull-down pre-driver 42, and a pull-down control section 43. The pull-down control signal generation section 41 may include inverters IV41 and IV42 and a NAND gate NAND41. The inverter IV41 may invert the termination enable signal ODT._EN, and output a resultant signal. The NAND gate NAND41 may perform a NAND operation on the output of the inverter IV41 and the test mode signal TM, and output a resultant signal. The inverter IV42 may invert the output of the NAND gate NAND41, and generate a pull-down control signal PD_CNT. The pull-down control signal generation section 41 may generate an enabled pull-down control signal PD_CNT, which is at a logic high level, in response to the enabled test mode signal TM, which is at the logic high level, and the disabled termination enable signal ODT_EN, which is at the logic low level.

The pull-down pre-driver 42 may include PMOS transistors P41 and P42 and NMOS transistors N41 and N42. The PMOS transistor P41 coupled between the power supply voltage VDD and a node nd41 may be turned on in response to the pull-down control signal PD_CNT. The PMOS transistor P42 coupled between the node nd41 and a node nd42 may be turned on in response to the pre-pull-down signal PRE_PD. The NMOS transistor N41 coupled between the node nd42 and a node nd43 may be turned on in response to the pre-pull-down signal PRE_PD. The NMOS transistor N42 coupled between the node nd43 and the ground voltage VSS may be turned on in response to the power supply voltage VDD. In the case where the PMOS transistor P41 is turned on in response to the disabled pull-down control signal PD CNT, which is at a logic low level, the pull-down pre-driver 42 may drive the node nd42 according to a logic level of the pre-pull-down signal PRE_PD, which is inputted in the read operation. In the case where the pre-pull-down signal PRE_PD of the logic high level is inputted in the read operation, the pull-down pre-driver 42 may drive the node nd42 with the ground voltage VSS, and generate the disabled pull-down signal PD, which is at the logic low level. In the case where the pre-pull-down signal PRE_PD that is at the logic low level is inputted in the read operation, the pull-down pre-driver 42 may drive the node nd42 with the power supply voltage VDD, and generate the enabled pull-down signal PD, which is at the logic high level.

The pull-down control section 43 may include an inverter IV43 and a PMOS transistor P43. The inverter IV43 may invert the pull-down control signal PD_CNT, and output a resultant signal. The PMOS transistor P43 may be coupled between the power supply voltage VDD and the node nd42, and be turned on by being inputted with the output of the inverter IV43. In the case where the PMOS transistor P43 is turned on in response to the enabled pull-down control signal PD_CNT, which is at the logic high level, the pull-down control section 43 may drive the node nd42 with the power supply voltage VDD, and generate the enabled pull-down signal PD, which is at the logic high level.

FIG. 5 is a diagram illustrating the pull-down signal generation unit 23 in accordance with an embodiment. Referring to FIG. 5, the pull-down signal generation unit 23 may include a pull-down control signal generation section 51, a pull-down pre-driver 52, a pull-down control section 53, and a buffer 54. The pull-down control signal generation section 51 may include inverters IV51 and IV52 and a NAND gate NAND51. The inverter IV51 may invert the termination enable signal ODT_EN, and output a resultant signal. The NAND gate NAND51 may perform a NAND operation on the output of the inverter IV51 and the test mode signal TM, and output a resultant signal. The inverter IV52 may invert the output of the NAND gate NAND51, and generate the pull-down control signal PD_CNT. The pull-down control signal generation section 51 may generate the pull-down control signal PD_CNT, which is at a logic high level, in response to the enabled test mode signal TM, which is at the logic high level, and the disabled termination enable signal ODT_EN, which is at the logic low level.

The pull-down pre-driver 52 may include PMOS transistors P51 and P52 and NMOS transistors N51 and N52. The PMOS transistor P51 coupled between the power supply voltage VDD and a node nd51 may be turned on in response to the pull-down control signal PD_CNT. The PMOS transistor P52 coupled between the node nd51 and a node nd52 may be turned on in response to the pre-pull-down signal PRE_PD. The NMOS transistor N51 coupled between the node nd52 and a node nd53 may be turned on in response to the pre-pull-down signal PRE_PD. The NMOS transistor N52 coupled between the node nd53 and the ground voltage VSS may be turned on in response to the power supply voltage VDD. In the case where the PMOS transistor P51 is turned on in response to the disabled pull-down control signal PD_CNT, which is at a logic low level, the pull-down pre-driver 52 may drive the node nd52 according to a logic level of the pre-pull-down signal PRE_PD, which is inputted in the read operation. In the case where the pre-pull-down signal PRE_PD of the logic high level is inputted in the read operation, the pull-down pre-driver 52 may drive the node nd52 with the ground voltage VSS. In the case where the pre-pull-down signal PRE_PD of the logic low level is inputted in the read operation, the pull-down pre-driver 52 may drive the node nd52 with the power supply voltage VDD.

The pull-down control section 53 may include an NMOS transistor N53. The NMOS transistor N53 coupled between the ground voltage VSS and the node nd52 may be turned on in response to the pull-down control signal PD_CNT. In the case where the NMOS transistor N53 is turned on in response to the enabled pull-down control signal PD_CNT, which is at the logic high level, the pull-down control section 53 may drive the node nd52 with the ground voltage VSS. The buffer 54 may include an inverter IV53. The buffer 54 may invert the signal of the node nd52, and generate the pull-down signal PD. The buffer 54 may generate the disabled pull-down signal PD, which is at the logic low level, in the case where the node nd52 is driven with the power supply voltage VDD, and generate the enabled pull-down signal PD, which is at the logic high level, in the case where the node nd52 is driven with the ground voltage VSS.

Operations according to an embodiment will be described below with reference to FIG. 6, based on the level of the data signal DQ according to the termination enable signal ODT_EN in the case where the semiconductor system or the semiconductor device is not in the test mode and in the case where the semiconductor system or the semiconductor device is in the test mode.

In a period T11 to T12, when the semiconductor system or the semiconductor device is not in the test mode, and the test mode signal TM is disabled, the termination enable signal ODT_EN is enabled to perform the termination operation. In the case where the termination operation is performed during a period that is not the test mode, the third pad 133 through which the data signal DQ is outputted may be driven with the power supply voltage VDD. Accordingly, the data signal DQ may have a logic high level.

In a period T12 to T13, when the semiconductor system or the semiconductor device is not in the test mode, and the test mode signal TM is still disabled, the termination operation is not performed and thus the termination enable signal ODT_EN is disabled. In the case where the termination operation is not performed during a period that is not the test mode, the third pad 133 through which the data signal DQ is outputted may float. Accordingly, the data signal DQ may not have any logic level.

In a period T13 to T14, the termination operation is not performed and thus the termination enable signal ODT_EN is disabled in the state where the test mode is entered and thus the test mode signal TM is enabled. In the case where the termination operation is not performed during a period that is the test mode, the third pad 133 through which the data signal DQ is outputted may be driven with the ground voltage VSS. Accordingly, the data signal DQ may have a logic low level.

In a period T14 to T15, the termination operation is performed and thus the termination enable signal ODT_EN is enabled in the state where the test mode is entered and thus the test mode signal TM is enabled. In the case where the termination operation is performed during a period which is the test mode, the third pad 133 through which the data signal DQ is outputted may be driven with the power supply voltage VDD. Accordingly, the data signal DQ may have the logic high level.

As described above, the third pad 133 is driven to a logic high level in the case where the termination enable signal ODT_EN is enabled and thus the termination operation is performed during a period that is not the test mode, and the third pad 133 floats in the case where the termination enable signal ODT_EN is disabled, and thus the termination operation is not performed during a period that is not the test mode. By contrast, in the test mode, when the termination enable signal ODT_EN is enabled and thus the termination operation is performed, the third pad 133 is driven to the logic high level, and when the termination enable signal ODT_EN is disabled and thus the termination operation is not performed, the third pad 133 is driven to a logic low level. Therefore, by sensing the voltage level of the third pad 133, it is possible to determine whether the termination operation is performed or not.

The semiconductor devices and the semiconductor system described above with reference to FIGS. 1 to 6 may be applied to an electronic system that includes a memory system, a graphic system, a computing system or a mobile system. For example, referring to FIG. 7, an electronic system 1000 in accordance with an embodiment may include a data storage 1001, a memory controller 1002, a buffer memory 1003, and an input/output interface 1004.

In response to control signals from the memory controller 1002, the data storage 1001 stores data applied from the memory controller 1002, and reads out stored data, and outputs the read-out data to the memory controller 1002. The data storage 1001 may include the second semiconductor device 12 shown in FIG. 1. The data storage 1001 may include a nonvolatile memory that can retain data even in the absence of power supplies. A nonvolatile memory may be realized as a flash memory such as a NOR flash memory and a NAND flash memory, a phase change random access memory (PRAM), a resistive random access memory (RRAM), a spin torque transfer random access memory (STTRAM) or a magnetic random access memory (MRAM).

The memory controller 1002 decodes commands applied through the input/output interface 1004 from an external device Host, and controls input/output of data with respect to the data storage 1001 and the buffer memory 1003 according to decoding results. The memory controller 1002 may include the first semiconductor device 11 shown in FIG. 1. While the memory controller 1002 is illustrated as having only one block in FIG. 7, the memory controller 1002 may include a controller for controlling the data storage 1001 such as a nonvolatile memory and a controller for controlling the buffer memory 1003 such as a volatile memory.

The buffer memory 1003 may temporarily store data to be processed in the memory controller 1002, that is, data to be inputted/outputted to/from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a dynamic random access memory (DRAM), a mobile DRAM, and a static random access memory (SRAM).

The input/output interface 1004 provides a communication between the memory controller 1002 and the external device Host such that the memory controller 1002 may receive control signals for input/output of data from the external device and exchange data with the external device. The input/output interface 1004 may include one or more of interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor device comprising:
   a pull-up signal generation unit suitable for generating a pull-up signal in response to a termination enable signal and a pre-pull-up signal;
   a pull-down signal generation unit suitable for generating a pull-down signal in response to a test mode signal, the termination enable signal, and a pre-pull-down signal, and
   wherein the termination enable signal is a signal which is generated in response to an external command and a termination control signal and the pull-up signgal controls a termination operation that couples a first resistor elelment between a first power supply voltage and a first node.

2. The semiconductor device according to claim 1, wherein the termination enable signal is enabled if a termination operation is performed.

3. The semiconductor device according to claim 1, wherein the pull-up signal generation unit generates an enabled pull-up signal if the termination enable signal is enabled.

4. The semiconductor device according to claim 1, wherein the signal levels of the pre-pull-up signal and the pre-pull-down signal are determined according to internal data outputted from a memory cell array in a read operation.

5. The semiconductor device according to claim 1, further comprising:
   a pull-up driver suitable for driving a data signal with a first power supply voltage in response to the pull-up signal; and
   a pull-down driver suitable for driving the data signal with a second power supply voltage in response to the pull-down signal.

6. The semiconductor device according to claim 5, wherein the pull-up driver comprises:
   a MOS transistor coupled between the first power supply voltage and a first node, the MOS transistor being suitable for being turned on in response to the pull-up signal; and
   a resistor element coupled between the first node and a second node through which the data signal is outputted.

* * * * *